US011369030B2

(12) United States Patent
Hashimoto (10) Patent No.: US 11,369,030 B2
(45) Date of Patent: Jun. 21, 2022

(54) ELECTRONIC DEVICE IN WHICH MAXIMUM NUMBER OF MOUNTABLE PRINTED CIRCUIT BOARDS IS CHANGEABLE

(71) Applicant: FANUC CORPORATION, Yamanashi (JP)

(72) Inventor: Yoshinari Hashimoto, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 144 days.

(21) Appl. No.: 16/779,992

(22) Filed: Feb. 3, 2020

(65) Prior Publication Data

US 2020/0253075 A1    Aug. 6, 2020

(30) Foreign Application Priority Data

Feb. 5, 2019    (JP) .............................. JP2019-018897

(51) Int. Cl.
*H05K 7/14* (2006.01)
*H05K 1/14* (2006.01)
*H05K 5/03* (2006.01)
*H05K 5/00* (2006.01)

(52) U.S. Cl.
CPC ........... *H05K 7/1439* (2013.01); *H05K 1/141* (2013.01); *H05K 5/0026* (2013.01); *H05K 5/03* (2013.01); *H05K 7/1427* (2013.01); *H05K 2201/048* (2013.01); *H05K 2201/10189* (2013.01)

(58) Field of Classification Search
CPC .... H05K 7/1441; H05K 7/141; H05K 7/1439; H05K 5/0026; H05K 5/03; H05K 7/1427
See application file for complete search history.

(56) References Cited

U.S. PATENT DOCUMENTS

| | | | | | |
|---|---|---|---|---|---|
| 4,179,172 | A | * | 12/1979 | Godsey ................ | H05K 7/1439 361/785 |
| 4,631,641 | A | * | 12/1986 | Brombal .............. | H05K 9/0016 361/752 |
| 4,679,121 | A | * | 7/1987 | Schomers ............ | H05K 7/1439 361/736 |
| 4,862,161 | A | * | 8/1989 | Schomers ............ | H05K 7/1459 361/785 |

(Continued)

FOREIGN PATENT DOCUMENTS

| | | |
|---|---|---|
| CN | 101196761 A | 6/2008 |
| JP | H07221475 A | 8/1995 |

(Continued)

*Primary Examiner* — Rockshana D Chowdhury
*Assistant Examiner* — Douglas R Burtner
(74) *Attorney, Agent, or Firm* — Robert P. Michal, Esq.; Carter, DeLuca & Farrell LLP (57) ABSTRACT

An electronic device includes a slot, and a backboard that is disposed on the depth side in the slot and is electrically connected to a printed circuit board inserted in the slot. The electronic device further includes a casing having the slot formed therein, the casing being configured to accommodate therein at least part of the backboard, and a cover member configured to be attachable to and removable from the casing. When attached to the casing, the cover member together with the casing forms the external appearance of the electronic device. The cover member is attached to the backboard integrally.

6 Claims, 5 Drawing Sheets

(56) References Cited

U.S. PATENT DOCUMENTS

| | | | | |
|---|---|---|---|---|
| 4,947,288 | A * | 8/1990 | Olsson | H05K 3/0064 361/796 |
| 5,827,074 | A * | 10/1998 | Gatti | H05K 1/14 439/61 |
| 6,239,984 | B1 * | 5/2001 | Koradia | H05K 7/1439 439/62 |
| 6,261,104 | B1 | 7/2001 | Leman | |
| 6,404,650 | B1 * | 6/2002 | Boniface | H05K 7/1439 361/752 |
| 7,170,749 | B2 * | 1/2007 | Hoshino | G06F 1/185 439/65 |
| 7,453,706 | B2 * | 11/2008 | Clark | H05K 7/1448 361/796 |
| 8,184,442 | B2 * | 5/2012 | Fujimura | H05K 7/1418 361/759 |
| 8,934,260 | B2 * | 1/2015 | Tanaka | H05K 9/0062 361/740 |
| 8,953,337 | B2 * | 2/2015 | Inoue | H05K 7/1445 211/41.17 |
| 10,004,150 | B2 * | 6/2018 | Dernier | H05K 5/0221 |
| 10,455,721 | B2 * | 10/2019 | Miura | H05K 7/1417 |
| 10,595,429 | B2 * | 3/2020 | Miura | H05K 7/1427 |
| 10,653,030 | B1 * | 5/2020 | Castro | H05K 5/03 |
| 2003/0117768 | A1 * | 6/2003 | Marcotte | H05K 7/1439 361/600 |
| 2004/0136167 | A1 * | 7/2004 | Sullivan | G06F 1/1632 361/728 |
| 2004/0192077 | A1 * | 9/2004 | Akamatsu | H05K 7/1439 439/61 |
| 2006/0044775 | A1 * | 3/2006 | Hoshino | H05K 7/1418 361/802 |
| 2007/0030658 | A1 * | 2/2007 | Norgard | H05K 7/1439 361/730 |
| 2011/0228473 | A1 * | 9/2011 | Anderson | H05K 7/1487 361/679.02 |
| 2011/0310575 | A1 * | 12/2011 | Chiu | G06F 1/186 361/759 |
| 2017/0112024 | A1 * | 4/2017 | Sato | H05K 7/20563 |
| 2017/0164499 | A1 * | 6/2017 | Shearman | H05K 7/1452 |
| 2019/0132953 | A1 * | 5/2019 | Yoshida | G05B 19/409 |
| 2019/0334264 | A1 * | 10/2019 | Bekke | H01R 12/716 |

FOREIGN PATENT DOCUMENTS

| | | |
|---|---|---|
| JP | H08256207 A | 10/1996 |
| JP | 2002-094265 A | 3/2002 |

* cited by examiner

ELECTRONIC DEVICE IN WHICH MAXIMUM NUMBER OF MOUNTABLE PRINTED CIRCUIT BOARDS IS CHANGEABLE

CROSS-REFERENCE TO RELATED APPLICATION

This application is based upon and claims the benefit of priority from Japanese Patent Application No. 2019-018897 filed on Feb. 5, 2019, the contents of which are incorporated herein by reference.

BACKGROUND OF THE INVENTION

Field of the Invention

The present invention relates to an electronic device.

Description of the Related Art

Japanese Laid-Open Patent Publication No. 2002-094265 discloses a technique aimed at facilitating installation and removal of expansion cards to and from electronic equipment.

SUMMARY OF THE INVENTION

Users who operate and maintain electronic devices occasionally desire to change the maximum number of printed circuit boards that are mountable to an electronic device. It is, for example, when they desire to expand functionality feasible by the electronic device in operation by connecting a larger number of expansion printed circuit boards to the electronic device.

However, it is difficult to change the maximum number of mountable printed circuit boards in an electronic device already fabricated. For example, the technique disclosed in Japanese Laid-Open Patent Publication No. 2002-094265 is not capable of changing the maximum number of attachable and removable expansion cards, though it allows expansion cards to be easily attached to and removed from electronic equipment.

Accordingly, an object of the present invention is to provide an electronic device in which the maximum number of printed circuit boards mountable thereto can be easily changed.

According to a first aspect of the present invention, there is provided an electronic device including: a slot, a backboard that is disposed on a depth side of the slot and is electrically connected to a printed circuit board inserted in the slot; a casing having the slot formed therein, the casing being configured to accommodate therein at least a part of the backboard; and a cover member configured to be attachable to and removable from the casing, wherein when attached to the casing, the cover member together with the casing forms an external appearance of the electronic device, wherein the cover member is attached to the backboard integrally.

According to a second aspect of the present invention, there is provided an electronic device including a casing having a slot formed therein, and a backboard that is disposed on a depth side of the slot in the casing and is electrically connected to a printed circuit board inserted in the slot. A connector is provided on a surface side of the casing so that an expansion backboard to which an expansion printed circuit board different from the printed circuit board inserted in the slot is electrically connected is electrically connected to the backboard through the connector.

The present invention thus provides an electronic device in which the maximum number of printed circuit boards mountable thereto can be easily changed.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

The present invention will now be described in detail while referring to the accompanying drawings in conjunction with preferred embodiments. In the description below, directions will be explained using the arrows shown in the drawings.

First Embodiment

Figure 1:
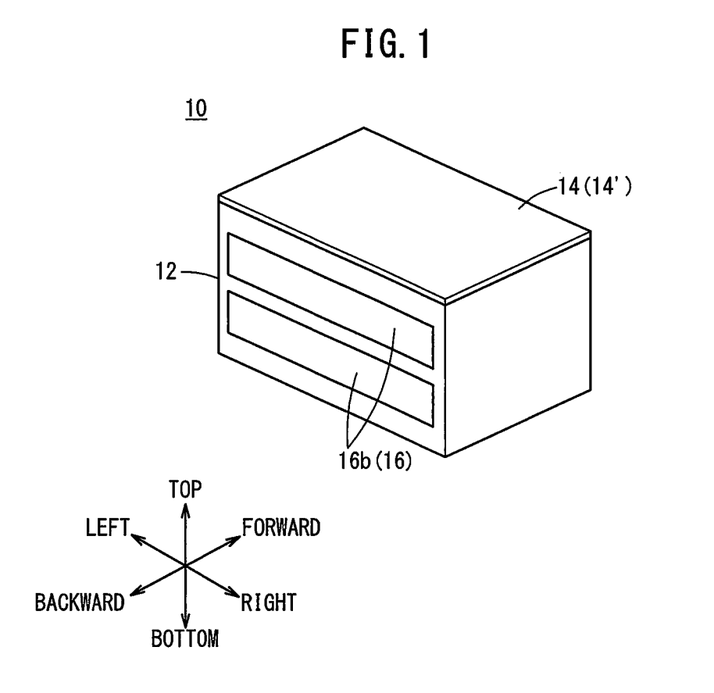
FIG. 1 is a first perspective view illustrating an electronic device according to a first embodiment.
Figure 2:
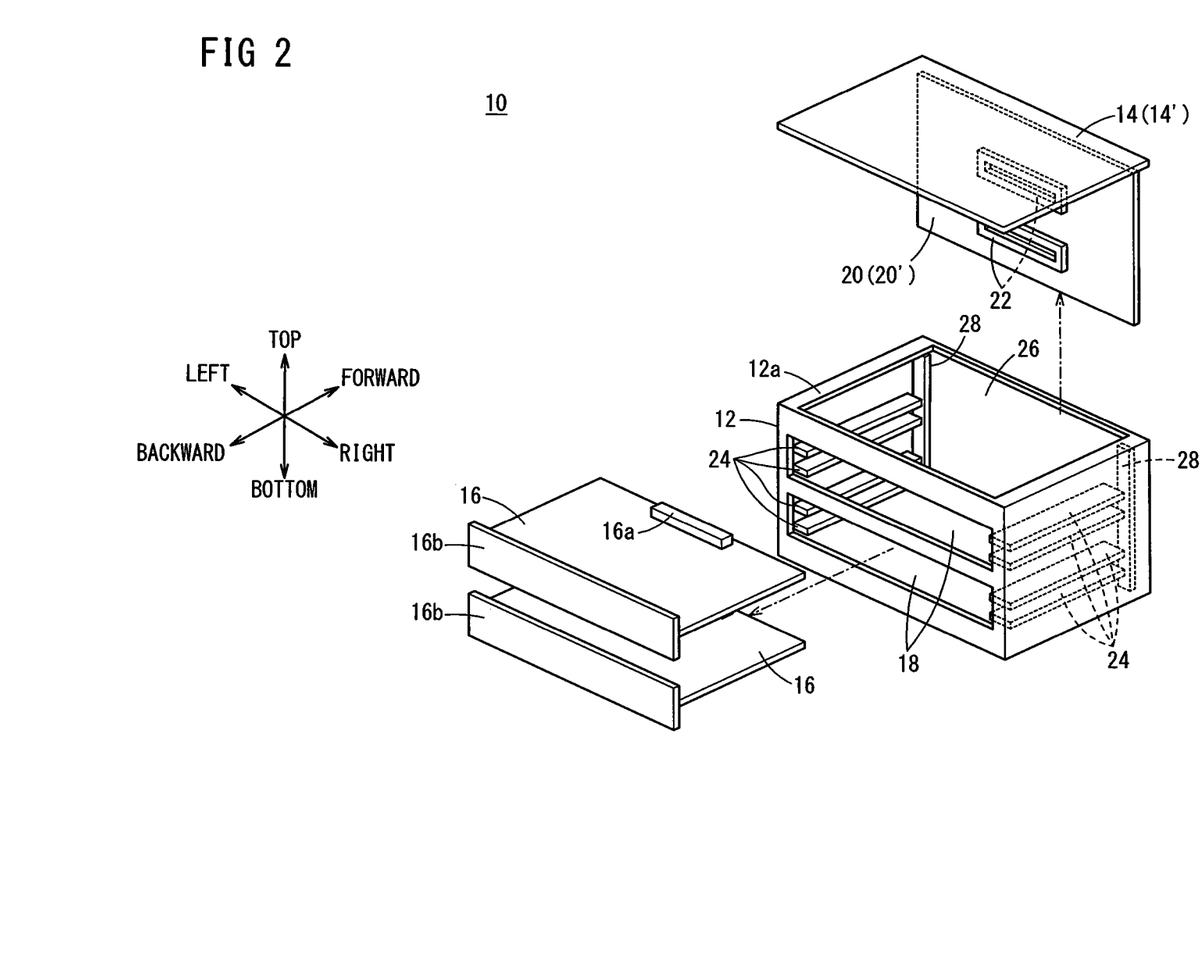
FIG. 2 is an exploded perspective view showing the electronic device of FIG. 1.

FIG. 1 is a first perspective view illustrating an electronic device 10 according to a first embodiment. FIG. 2 is an exploded perspective view showing the electronic device 10 of FIG. 1.

As shown in FIG. 1, the electronic device 10 includes a casing 12 and a cover member 14 that can be attached to and removed from the casing 12 and that constitutes the external appearance of the electronic device 10 together with the casing 12. In this embodiment, the cover member 14 attachable to and removable from the casing 12 is mounted on the top side of the casing 12. The cover member 14 may have members like handles or nobs for facilitating the work of attaching and removing the cover member to and from the casing 12.

As shown in FIG. 2, the electronic device 10 has slots 18 formed in the casing 12 so that printed circuit boards 16 can be inserted thereinto. The electronic device 10 further includes a backboard 20. The backboard 20 is connected to the printed circuit boards 16 on the depth side of the slots 18 (at ends of the slots on the forward side). The electronic device 10 thus structured is used as a control device for a panel-type PC with the backboard 20 connected to a display device through the casing 12, for example.

The backboard 20 of this embodiment is integral with the cover member 14. With this configuration, the backboard 20 can be easily removed from the casing 12 at the same time as the cover member 14 is removed from the casing 12, with the printed circuit boards 16 extracted from the slots 18. Means for integrating the cover member 14 and the backboard 20 is not particularly limited. For example, the cover member 14 and the backboard 20 may be bonded together by an adhesive.

Each printed circuit board 16 has a board-side connector 16a at its end in the insertion direction (on the forward side). The board-side connector 16a of the printed circuit board 16 inserted in the slot 18 is connected to a first connector 22 of the backboard 20 on the depth side of the slot 18. As shown in FIGS. 1 and 2, each printed circuit board 16 may further have a faceplate 16b at its end in the extraction direction (on the backward side). The faceplate 16b may engage with part of the casing 12 when the printed circuit board 16 is inserted in the slot 18. This prevents the printed circuit boards 16 from falling off the slots 18, for example.

Each slot 18 formed in the casing 12 has a pair of first guide rails 24 disposed on each end in the right-left direction to extend in the front-rear direction. The printed circuit board 16 can thus be easily moved along the front-rear direction, with the printed circuit board 16 being held between the pair of first guide rails 24.

The number of the slots 18 formed in the casing 12 is not particularly limited; two slots 18 are formed in this embodiment. In this case, for example, it is possible to insert a printed circuit board 16 being a main board in one of the two slots 18 of the electronic device 10 and insert a printed circuit board 16 being a power-supply board in the other. Now, as mentioned earlier, a user may desire to change the maximum number of printed circuit boards 16 that are mountable to the electronic device 10 to three or more. As will be explained below, according to the electronic device 10 of this embodiment, it is possible to easily change the maximum number of mountable printed circuit boards 16.

Figure 3:
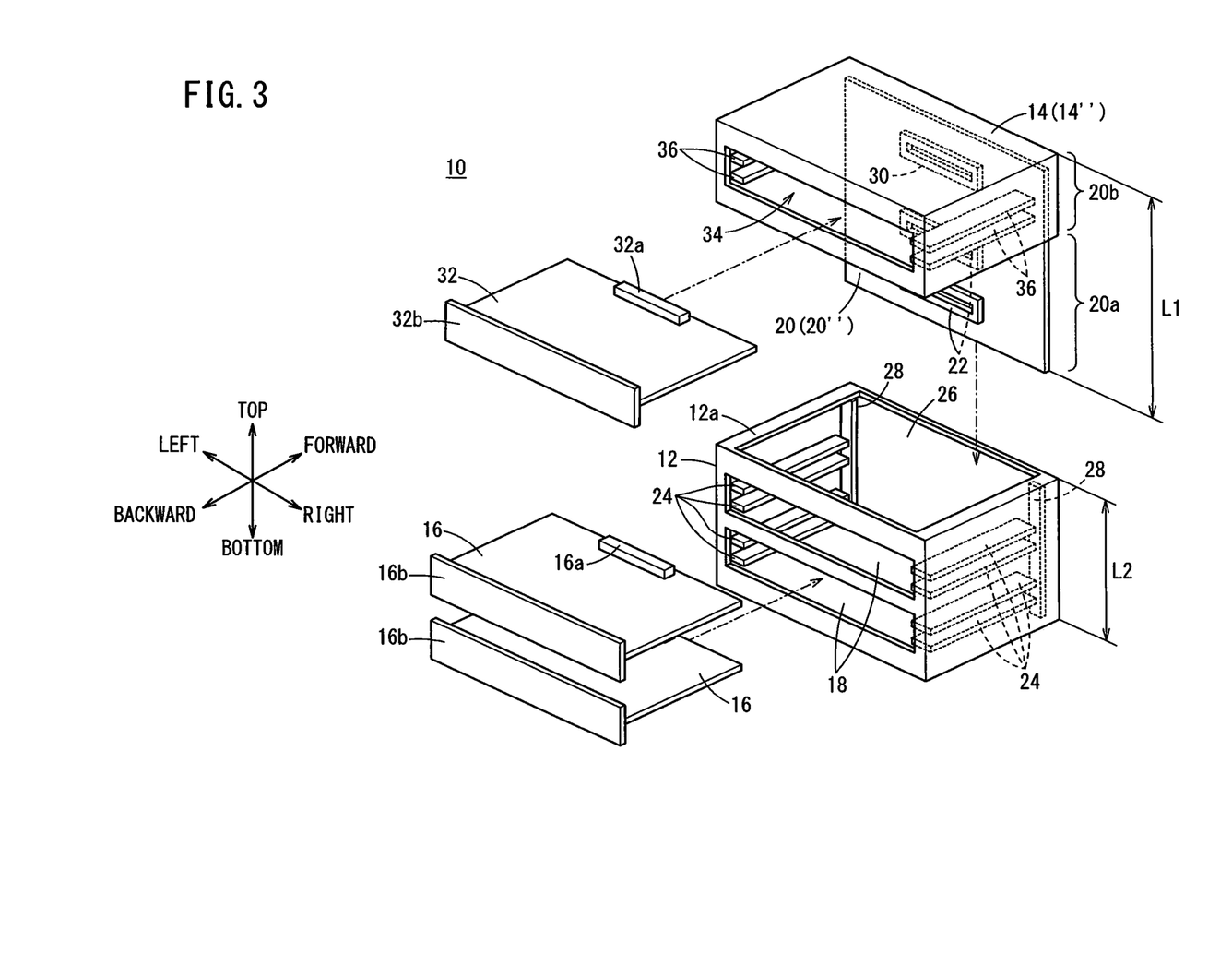
FIG. 3 is a perspective view of the electronic device of the first embodiment where the backboard is being changed.

FIG. 3 is a perspective view of the electronic device 10 of the first embodiment during the work of changing the backboard 20.

As shown in FIG. 3, a backboard 20 different from the backboard 20 of FIG. 2 can be inserted in the casing 12. For the sake of convenience, the backboard 20 of FIG. 2 will hereinafter be also referred to as backboard 20'. Also, for convenience, the backboard 20 of FIG. 3, which is different from that of FIG. 2, will be referred to also as backboard 20".

At a top surface 12a of the casing 12, second guide rails 28 are provided to extend downward from an opening 26 through which the inside of the casing 12 is exposed to outside when the cover member 14 is removed. Hence, in this embodiment, it is possible to easily place the backboard 20" on the depth side of the slots 18 by inserting the backboard 20" downward along the second guide rails 28.

Now, as shown in FIG. 3, a length L1 of the backboard 20" in the top-bottom direction may be longer than a length L2 of the casing 12 (L1>L2). That is, the backboard 20" has a first area 20a (part 20a) that is accommodated in the casing 12 and a second area 20b that is not accommodated in the casing 12.

The backboard 20" includes first connectors 22 in the first area 20a. The backboard 20" further includes a second connector 30 in the second area 20b, which is electrically connected to a printed circuit board 16 that is different from the printed circuit boards 16 inserted in the slots 18. The printed circuit board 16 connected to the second connector 30 will hereinafter be referred to also as an expansion printed circuit board 32.

The positions of the first connectors 22 in the first area 20a are the same as those on the backboard 20', which correspond to the positions of the slots 18. The expansion printed circuit board 32 has an expansion-board-side connector 32a that can be connected to the second connector 30.

As shown in FIG. 3, the expansion printed circuit board 32 may further include a faceplate 32b.

Similarly to the backboard 20', a cover member 14 is integrally attached also to the backboard 20". For the sake of convenience, the cover member 14 attached to the backboard 20' is also referred to as cover member 14'. Further, for convenience, the cover member 14 attached to the backboard 20" will be referred to also as cover member 14".

Unlike the cover member 14', the cover member 14" covers not only the top side of the backboard 20". Specifically, as shown in FIG. 3, the cover member 14" covers the second area 20b of the backboard 20" from the top, right and left, and forward sides. The second area 20b of the backboard 20" and the expansion printed circuit board 32 connected to the backboard 20" in the second area 20b are thus protected.

In this embodiment, an expansion slot 34 is formed in the cover member 14". That is, a pair of third guide rails 36 are provided on each end in the right-left direction inside the cover member 14", in order to guide the expansion printed circuit board 32 to the second connector 30. The direction in which the third guide rails 36 of this embodiment extend is the same as the direction in which the first guide rails 24 extend (the forward-backward direction). This makes it easy to connect the expansion-board-side connector 32a of the expansion printed circuit board 32 to the second connector 30. The above-mentioned faceplate 32b of the expansion printed circuit board 32 may engage with part of the cover member 14" when the expansion printed circuit board 32 is inserted in the expansion slot 34. This prevents the expansion printed circuit board 32 from falling off the expansion slot 34.

Figure 4:
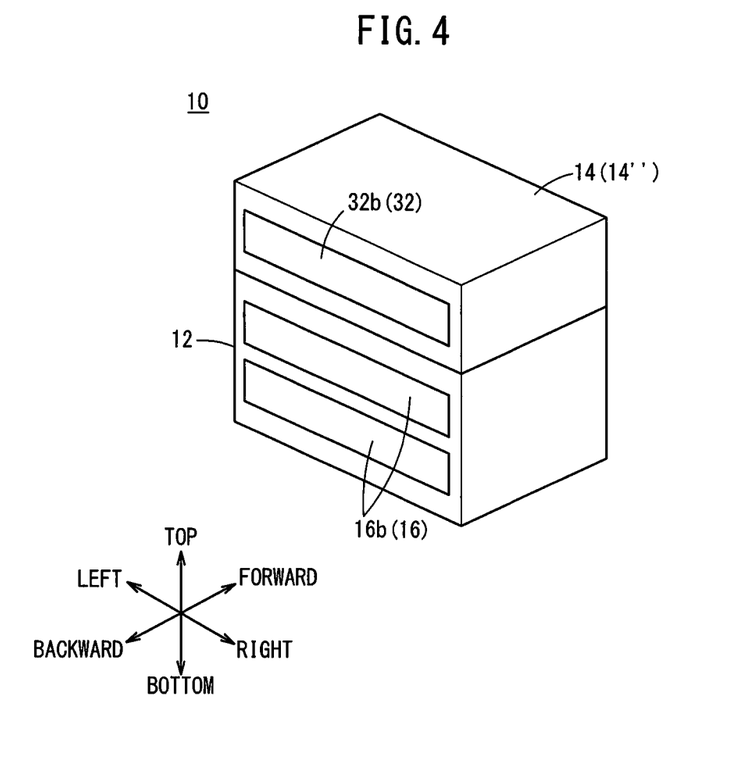
FIG. 4 is a second perspective view of the electronic device of the first embodiment.

FIG. 4 is a second perspective view showing the electronic device 10 of the first embodiment.

As shown in FIG. 4, when the backboard 20" is placed in the casing 12, the electronic device 10 is mounted with the printed circuit boards 16 inserted respectively in the two slots 18 formed in the casing 12 and the expansion printed circuit board 32 inserted in the expansion slot 34. In this way, the electronic device 10 of this embodiment is capable of easily changing the maximum number of mountable printed circuit boards 16 by changing the backboards 20.

In the use of the electronic device 10, the user may prepare other backboard(s) 20 than the above-described backboard 20' and backboard 20". That is, the electronic device 10 is capable of selective placement of a plurality of backboards 20 having different numbers of second connector(s) 30. For example, although the backboard 20 (backboard 20") shown in FIGS. 3 and 4 has a single second connector 30, a backboard 20 having two or more second connectors 30 may be selectively placed in the casing 12.

[Modification]

The first embodiment has been described as an example of the present invention and the above-described first embodiment can of course be modified or improved in various manners. It is clear from recitation of claims that such modified or improved embodiments are also included in the technical scope of the present invention.

(First Modification)

The numbers and configuration of the first connector(s) 22, slot(s) 18, and first guide rails 24 are not limited to those of the first embodiment. For example, two slots 18 may be formed side by side in the right-left direction, sectioned by an inner wall provided in the casing 12. Further, one or some of a plurality of slots 18 may be formed for insertion of expansion printed circuit board(s) 32. In such a case, the backboard 20 may have second connector(s) 30 in the first area 20a in position(s) corresponding to the slot(s) 18 in which the expansion printed circuit board(s) 32 are inserted.

Second Embodiment

Now, a second embodiment will be described. In order to simplify description, the same constituent elements as those of the first embodiment will be labeled using the same reference numerals as those of the first embodiment and may not be described again.

Figure 5:
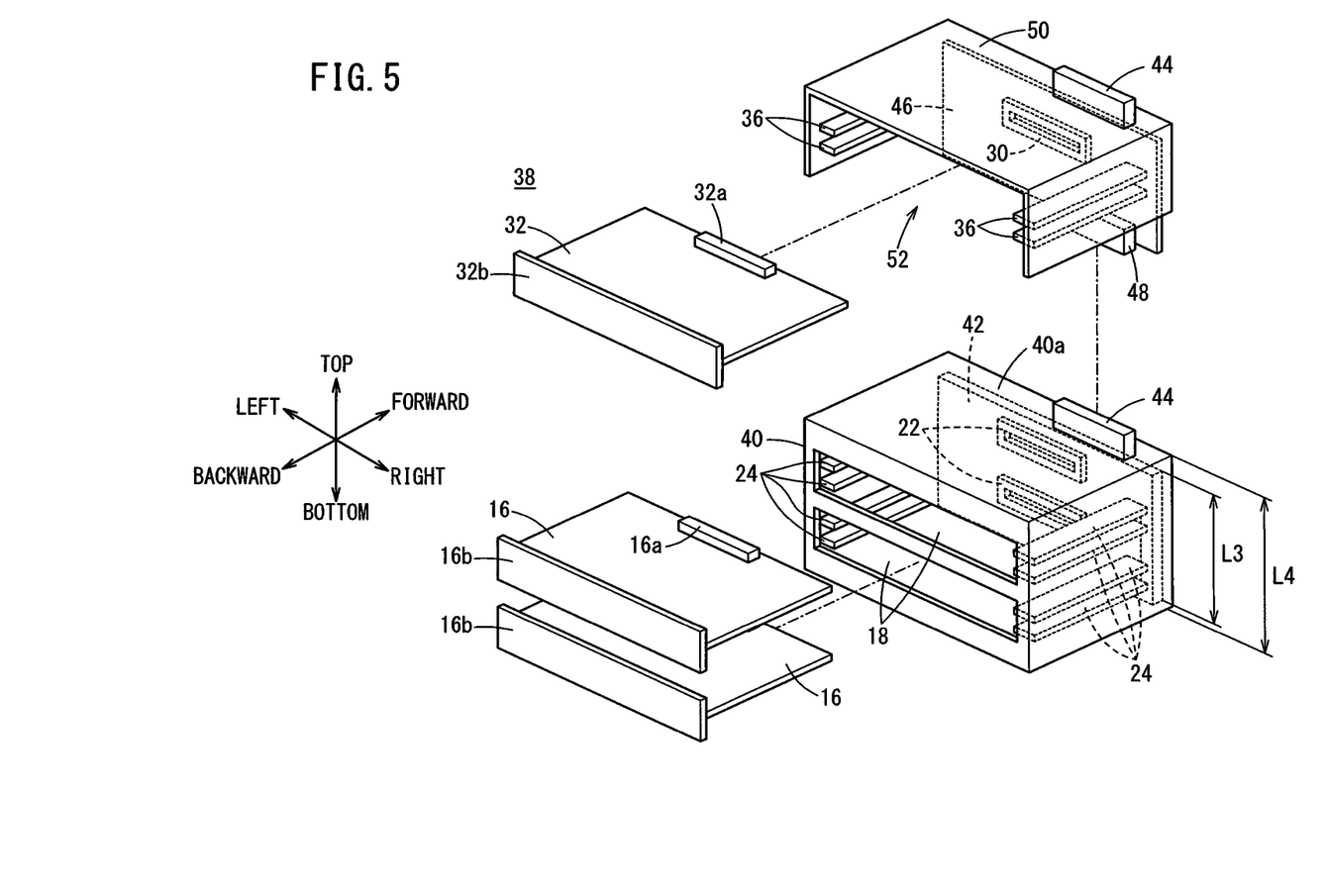
FIG. 5 is a perspective view illustrating an electronic device according to a second embodiment.

FIG. 5 is a perspective view illustrating an electronic device 38 according to the second embodiment.

The electronic device 38 of this embodiment is a numerical control device including a casing 40 having slots 18 formed therein and a backboard 42 that is placed on the depth side of the slots 18 in the casing 40 and electrically connected to printed circuit boards 16 inserted in the slots 18. As in the first embodiment, the slots 18 each have first guide rails 24.

Unlike the backboard 20 of the first embodiment, the backboard 42 of this embodiment is completely accommodated in the casing 40 when placed on the depth side of the slots 18. That is, in the top-bottom direction in FIG. 5, a length L3 of the backboard 42 is shorter than a length L4 of the casing 40 (L3<L4).

The backboard 42 has first connectors 22, like those of the first embodiment, formed in positions corresponding to the slots 18 within the casing 40. The backboard 42 is not limited to the example shown in FIG. 5 but it may have second connector(s) 30 in position(s) corresponding to the slots 18 in the casing 40.

A third connector 44 electrically connected to the backboard 42 is provided on a surface 40a of the casing 40 positioned on the top side thereof. A fourth connector 48 provided on an expansion backboard 46 can be connected to the third connector 44. Accordingly, the backboard 42 in the casing 40 and the expansion backboard 46 outside of the casing 40 can be electrically connected by connecting the third connector 44 provided on the casing 40 and the fourth connector 48 provided on the expansion backboard 46.

In addition to the fourth connector 48, the expansion backboard 46 further includes a second connector 30 similar to that of the first embodiment. Thus, a different expansion printed circuit board 32 from the printed circuit boards 16 inserted in the slots 18 can be electrically connected to the expansion backboard 46. In this embodiment, when the backboard 42 and the expansion backboard 46 are connected together, the direction in which the first connectors 22 of the backboard 42 face is the same as the direction in which the second connector 30 of the expansion backboard 46 faces.

Further, an expansion cover member 50 is integrally attached to the expansion backboard 46. The external appearance of the expansion cover member 50 of this embodiment is similar to the external appearance of the cover member 14 of the first embodiment. That is, the expansion cover member 50 covers the top, right and left, and forward sides of the expansion backboard 46. The expansion backboard 46 and an expansion printed circuit board 32 connected to the expansion backboard 46 are thus protected. The expansion cover member 50 may be omitted when it is not necessary.

In this embodiment, an expansion slot 52 is formed in the expansion cover member 50. Like the expansion slot 34 of the first embodiment, the expansion slot 52 of this embodiment has third guide rails 36 for guiding the expansion printed circuit board 32 to the second connector 30. It is hence possible to easily connect the expansion printed circuit board 32 to the expansion backboard 46. The expansion slot 52 (the third guide rails 36) may be omitted from the expansion cover member 50 when it is not necessary.

In this embodiment, as shown in FIG. 5, the third connector 44 electrically connected to the expansion backboard 46 is provided so as to face upward. Accordingly, still another expansion backboard 46 can be connected on top of the expansion backboard 46. Consequently, a desired number of expansion printed circuit boards 32 can be mounted to the electronic device 38 of this embodiment. Among a plurality of expansion backboards 46 thus joined together, the expansion backboard 46 disposed on the topmost side of the casing 40 does not need a third connector 44. In such a case, the user will prepare an expansion backboard 46 having no third connector 44 and attach this expansion backboard 46 on the topmost side of the casing 40.

With the electronic device 38 above, the third connector 44 provided on the surface 40a side of the casing 40 and the fourth connector 48 provided on the expansion backboard 46 are electrically connected together. The expansion backboard 46 has the second connector 30 and so the expansion printed circuit board 32 can be connected to the backboard 42 through the expansion backboard 46. When the expansion printed circuit board 32 is not necessary, the expansion printed circuit board 32 can be removed from the casing 40 together with the expansion backboard 46. In this way, according to the electronic device 38 of this embodiment, the maximum number of mountable printed circuit boards 16 can be easily changed.

[Modification]

The second embodiment has been described as an example of the present invention and the above-described second embodiment can of course be modified or improved in various manners. It is clear from recitation of claims that such modified or improved embodiments are also included in the technical scope of the present invention.

[Second Modification]

The third connector 44 that can be connected to the fourth connector 48 of the expansion backboard 46 may be provided on the top surface of the cover member 14 of the first embodiment in a state where it is electrically connected to the backboard 20. This allows the expansion backboard 46 to be applied also to the electronic device 10 of the first embodiment. The embodiments and modifications described above can thus be appropriately combined together without incurring contradictions.

Invention Obtained from Embodiments

The invention obtainable from the embodiments and modifications above will be recited below.

First Invention

The electronic device (10) includes a slot (18); a backboard (20) that is disposed on a depth side of the slot (18) and is electrically connected to a printed circuit board (16) inserted in the slot (18); a casing (12) having the slot (18) formed therein, the casing being configured to accommodate therein at least a part (20a) of the backboard (20); and a cover member (14) configured to be attachable to and removable from the casing (12), wherein when attached to the casing (12), the cover member together with the casing (12) forms an external appearance of the electronic device (10), wherein the cover member (14) is attached to the backboard (20) integrally.

It is thus possible to easily change the backboards (20) in the casing (12). It is also possible to easily change the maximum number of printed circuit boards (16) that can be mounted to the backboard (20).

The backboard (20) may include a first connector (22) configured to be electrically connected to the printed circuit board (16) inserted in the slot (18); and a second connector (30) configured to be electrically connected to an expansion printed circuit board (32) different from the printed circuit board (16) inserted in the slot (18). The second connector (30) may be disposed in a part (20b) of the backboard (20) that is not accommodated in the casing (12), and the cover member (14) may cover the part (20b) of the backboard (20) not accommodated in the casing (12) and the expansion printed circuit board (32) connected to the backboard (20). It is thus possible to protect the part (20b) of the backboard (20) not accommodated in the casing (12) and the expansion printed circuit board (32) connected to the backboard (20).

A plurality of backboards (20) having different numbers of the second connector(s) (30) may be selectively mounted to the casing (12). It is thus possible to easily change the maximum number of printed circuit boards (16) that can be mounted to the backboard (20).

The cover member (14) may have formed therein an expansion slot (34) configured to guide the expansion printed circuit board (32) to the second connector (30). Thus, the expansion printed circuit board (32) can be connected to the second connector (30) easily.

A third connector (44) may be provided on a surface (12a) side of the cover member (14) so that an expansion backboard (46) to which an expansion printed circuit board (32) different from the printed circuit board (16) inserted in the slot (18) is electrically connected can be electrically connected to the backboard (20) through the third connector (44). It is thus possible to easily change the maximum number of printed circuit boards (16) that can be mounted to the electronic device (10).

The expansion backboard (46) may also be provided with the third connector (44). Thus, still another expansion backboard (46) can be connected to the expansion backboard (46). A desired number of expansion printed circuit boards (32) can thus be mounted to the electronic device (10).

Second Invention

The electronic device (38) includes a casing (40) having a slot (18) formed therein and a backboard (42) that is disposed on a depth side of the slot (18) in the casing (40) and is electrically connected to a printed circuit board (16) inserted in the slot (18). In the electronic device (38), a connector (44) is provided on a surface (40a) side of the casing (40) so that an expansion backboard (46) to which an expansion printed circuit board (32) different from the printed circuit board (16) inserted in the slot (18) is electrically connected can be electrically connected to the backboard (42) through the connector (44).

It is thus possible to easily change the maximum number of printed circuit boards (16) that can be mounted to the electronic device (38).

The electronic device may further include an expansion cover member (50) attached to the expansion backboard (46) integrally, wherein the expansion cover member (50) may cover the expansion backboard (46) and the expansion printed circuit board (32) connected to the expansion backboard (46). It is thus possible to protect the expansion backboard (46) and the expansion printed circuit board (32) connected to the expansion backboard (46).

The expansion backboard (46) or the expansion cover member (50) that is attached to the expansion backboard (46) integrally may also be provided with the connector (44). Thus, still another expansion backboard (46) can be connected to the expansion backboard (46). A desired number of expansion printed circuit boards (32) can thus be mounted to the electronic device (38).

What is claimed is:

1. An electronic device comprising:
    a slot;
    a backboard that is disposed on a depth side of the slot and is electrically connected to a printed circuit board inserted in the slot;
    a casing having the slot formed therein, the casing being configured to accommodate therein at least a part of the backboard; and
    a cover member configured to be attachable to and removable from the casing, wherein the backboard is integrally attached to the cover member and unattached to the casing such that the backboard and the cover member are removable from the casing together as one unit upon removing the cover member from the casing in a direction parallel with a plane defined by the backboard, wherein when attached to the casing, the cover member together with the casing forms an external appearance of the electronic device,
    wherein the cover member is formed with an expansion slot in which an expansion printed circuit board is inserted, the expansion printed circuit board being different from the printed circuit board inserted in the slot of the casing.

2. The electronic device according to claim 1,
    wherein the backboard includes:
        a first connector configured to be electrically connected to the printed circuit board; and
        a second connector configured to be electrically connected to the expansion printed circuit board,
    the second connector is disposed in a part of the backboard that is not accommodated in the casing, and
    the cover member covers the part of the backboard not accommodated in the casing and the expansion printed circuit board connected to the backboard.

3. The electronic device according to claim 2, wherein the backboard comprises a plurality of backboards having different numbers of the second connectors, and the backboards are selectively mounted to the casing.

4. The electronic device according to claim 2, wherein the expansion slot is configured to guide the expansion printed circuit board to the second connector.

5. An electronic device comprising:
    a casing having a slot formed therein;
    a backboard that is disposed on a depth side of the slot in the casing and is electrically connected to a printed circuit board inserted in the slot;
    an expansion backboard;
    an expansion printed circuit board different from the printed circuit board inserted in the slot, the expansion printed circuit board being electrically connected to the expansion backboard;
    a connector attached to a surface side of the casing so that the expansion backboard is electrically connected to the backboard through the connector; and
    an expansion cover member attached to the expansion backboard, wherein the expansion cover member covers the surface side of the casing, the expansion backboard, and the expansion printed circuit board, wherein the expansion cover member and the surface side of the casing define an expansion slot therebetween configured for receipt of the expansion printed circuit board in a direction parallel with an insertion direction of the printed circuit board into the slot of the casing.

6. The electronic device according to claim 5, wherein the expansion backboard or the expansion cover member that is attached to the expansion backboard is provided with another connector.

\* \* \* \* \*